United States Patent [19]
Gurnick et al.

[11] Patent Number: 5,100,599
[45] Date of Patent: Mar. 31, 1992

[54] METHOD FOR PRODUCING THIN FILM PARTICULATES OF CONTROLLED SHAPE

[75] Inventors: Robert J. Gurnick, Tukwila; David G. Jensen, Auburn, both of Wash.

[73] Assignee: The Boeing Company, Seattle, Wash.

[21] Appl. No.: 366,630

[22] Filed: Jun. 15, 1989

[51] Int. Cl.⁵ ............... C23C 14/00; C23C 16/00; B29C 41/00
[52] U.S. Cl. .................. 264/81; 75/954; 264/221
[58] Field of Search ........... 264/81, 219, 221, 317, 264/301; 75/954; 427/404; 204/192.1

[56] References Cited

U.S. PATENT DOCUMENTS

| | | | |
|---|---|---|---|
| 3,561,993 | 2/1971 | Geffcken | 117/33.3 |
| 4,116,710 | 9/1978 | Heikel | 75/954 |
| 4,250,127 | 2/1981 | Warren et al. | 264/221 |
| 4,278,710 | 7/1981 | Jelks | 427/250 |
| 4,321,087 | 3/1982 | Levine et al. | 75/0.5 A |

*Primary Examiner*—James Lowe
*Assistant Examiner*—Christopher A. Fiorilla
*Attorney, Agent, or Firm*—Seed and Berry

[57] ABSTRACT

Particulate matter having precisely controlled length, width, thickness (i.e., height) and shape is produced with photolithographic techniques using a release film. In accordance with the method, a first photoresist layer is cured upon a substrate and a second photoresist layer is selectively cured upon the first photoresist to provide a desired pattern. The uncured portions of the second photoresist layer are removed so that a plurality of first and second deposition sites are produced wherein each said first and second deposition site has the desired area and wherein each first deposition site is located in a first plane and each second deposition site is located in a second plane. Further, portions of the substrate which are not part of the first deposition site are not located in the first plane and portions of the substrate which are not part of a second deposition site are not located in the second plane. The desired material is deposited using line-of-sight chemical deposition techniques. The particulate matter produced thereby may then be removed using a wash and may be separated from the wash. Particulate having a controlled area and thickness will result.

12 Claims, 2 Drawing Sheets

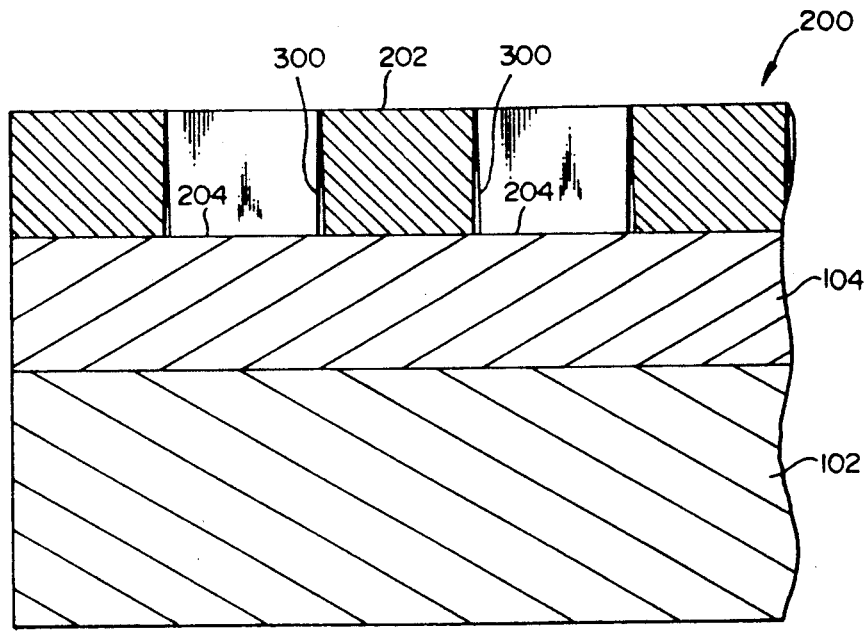
FIG. 3
FIG. 4
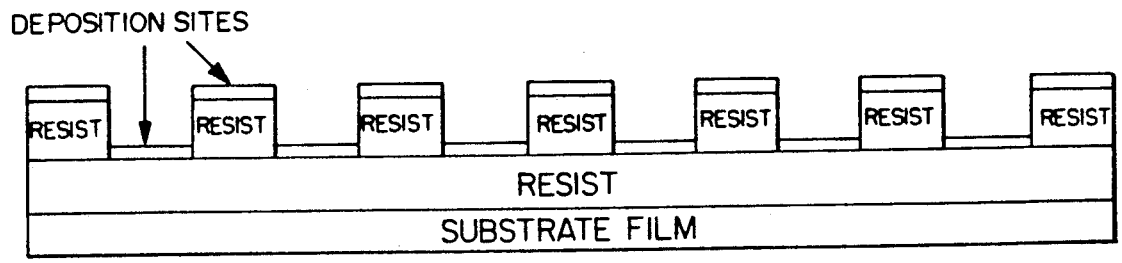

METHOD FOR PRODUCING THIN FILM PARTICULATES OF CONTROLLED SHAPE

STATEMENT OF GOVERNMENT RIGHTS

This invention was made with government support under contract F33657-86-C-2085 awarded by the United States Air Force. The Government has certain rights in this invention.

TECHNICAL FIELD OF THE INVENTION

The present invention is directed toward manufacture of thin film particulates and, more particularly, toward a method for producing thin film particulates of controlled area (i.e., length, width, and shape) and thickness.

BACKGROUND OF THE INVENTION

One method of controlling the electromagnetic properties of vehicles is to provide a coating having known electromagnetic characteristics. Such coating typically includes a predetermined density of particulate matter wherein the particulate comprises a specified material having dimensions selected to provide the coating with the desired electromagnetic characteristics. Various methods for producing the particulate matter are known in the art.

Of the known methods for producing particulates, each suffers from one or more disadvantages. One of the primary disadvantages of known techniques is the inability to produce particles of a predetermined shape. All presently known techniques produce randomly shaped particles. Since the electromagnetic characteristics of the particles are in large measure a function of the shape thereof, the inability to produce particles of predetermined shape presents a built-in design inefficiency preventing the designer of the coating from achieving optimum electromagnetic performance. For this reason, these methods are not desirable.

In addition to being unable to produce particles of predetermined shape, prior art methods are further unable to produce particles of predetermined size. Prior art methods for producing particulates can, at best, produce particulates of a known size distribution requiring sorting to obtain particles within an acceptable size range. As discussed above, these methods are also incapable of producing particulate of predetermined shape.

Further, methods which require sorting are undesirable insofar as particles that are sorted out constitute waste. To eliminate or reduce this waste, the tolerance range of acceptable size of the particles to be produced must be increased. However, any deviation from the optimum size of the particles to be produced results in less than optimum electromagnetic characteristics of the resultant coating. Accordingly, these methods also require substantial compromise in performance of the resultant particles to allow manufacture with acceptable amounts of waste.

Accordingly, there exists a need for a method to produce particulate matter of controlled length, width and thickness.

BRIEF DESCRIPTION OF THE INVENTION

The present invention comprises a method for producing particulate matter of controlled area. The method comprises the steps of configuring a substrate to include a first plurality of deposition sites located in at least a first plane wherein the size and shape of the area of each deposition site is configured to the desired size and shape of the area of the particles to be produced. In accordance with the invention, portions of the substrate that surround each first deposition site are not located in the first plane. The method further includes the steps of depositing a predetermined material upon the substrate and removing the deposited material from the substrate to obtain a plurality of particles having the desired area.

In addition to the foregoing steps, the method may further include the step of combining the particulate matter with a binder to produce a coating material having electromagnetic characteristics which are, in large measure, a function of by the electromagnetic characteristics of the particulate matter.

Other methods which are considered to be invention are particularly pointed out and distinctly claimed in the numbered paragraphs appended hereto. The invention, however, both as to organization and method of practice, may best be understood by a reading of the following detailed description taken in conjunction with the drawings.

BRIEF DESCRIPTION OF THE DRAWINGS

FIG. 3 is a cross-sectional view of the substrate illustrated in FIGS. 1 and 2.

DETAILED DESCRIPTION OF THE INVENTION

Figure 1:
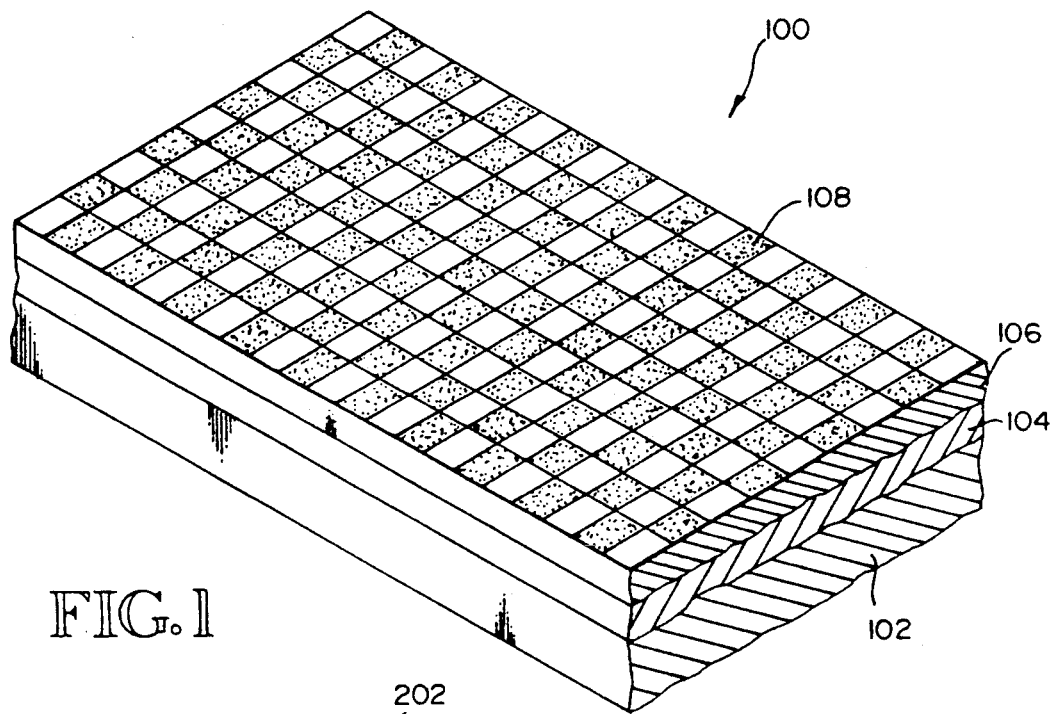
FIG. 1 is an isometric view of the substrate which is used to produce the particles that are the subject of the present invention.

In accordance with the present invention, particulate matter of controlled area (i.e., length, width, and shape) and thickness is produced using a specially contoured substrate. With reference to FIG. 1, an intermediate substrate 100 is illustrated which comprises the contoured substrate during intermediate stages of its configuration. The substrate includes a base portion 102. The base portion 102 is comprised of a material which is selected to survive the temperature and environmental effects of the thin film deposition techniques as well as the substrate configuration techniques described herein. In the presently preferred embodiment of the invention, base portion 102 comprises an elongate sheet of polymeric material such as Mylar ™ or nylon. However, it should be appreciated by those skilled in the art that other polymers may be used and, indeed, rigid substrates such as glasses and polycarbonates may be used.

Intermediate substrate 100 further includes a first photoresist layer 104 which has been deposited upon the base portion 102 of the intermediate substrate 100. The first photoresist layer 104 may be any photoresist material commonly used in photolithographic techniques, or other similar applications. The photoresist layer 104 comprises a deposition site whereupon a portion of the particulate matter will be formed, as will be described more fully below. After depositing the first photoresist layer 104, the intermediate substrate 100 is exposed to ultraviolet light to cure, or polymerize, the photoresist layer 104, as is known in the art.

The intermediate substrate 100 further includes a second photoresist layer 106 which has been deposited upon the first photoresist layer 104. A mask 108 is placed upon the second photoresist layer 106. As is known in the art, the mask 108 includes opaque portions which are impervious to ultraviolet light and transparent portions which transmit ultraviolet light so that when exposed, only those portions of the second photoresist layer 106 that are covered by transparent portions of the mask 108 are cured by the ultraviolet light. As will be described more fully below, the area (i.e., length, width and shape) of the opaque portions and transparent portions of the mask 108 will determine the area of the resultant particles. It will be apparent to those skilled in the art that other methods for selectively curing the photoresist layer 106 may be used with the invention described herein.

Figure 2:
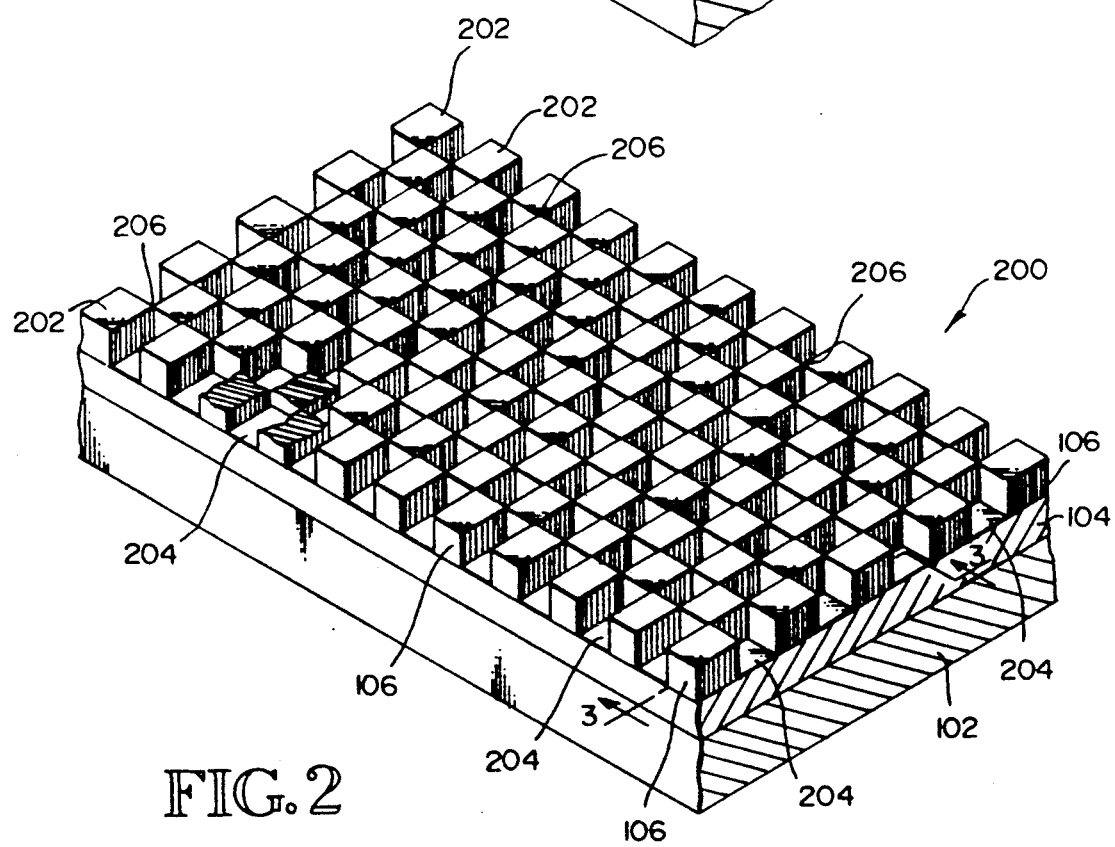
FIG. 2 is an isometric view of the configured substrate.

As is known in the art, after the selective curing, the mask 108 is removed and the uncured portions of photoresist (i.e., those that have not been exposed to ultraviolet light) may then also be removed. The uncured portions may be removed, for example, by washing using a suitable solvent. After the unexposed portions of the second photoresist layer 106 have been removed, the substrate comprises a configured substrate 200, as illustrated in FIG. 2. It will be apparent that the configured substrate includes a plurality of first deposition sites 202, each of which lies in a first plane located on the remaining horizontal surface portions of the second photoresist layer 106. Further, the area (i.e., length, width and shape) of each deposition site 202 is determined by the area of the transparent portions of the mask 108 and, accordingly, is configured to the desired area of the resultant particles. It will also be apparent that portions of the configured substrate 200 which border each first deposition site 202 do not lie in the same plane as the first deposition site.

In the presently preferred embodiment of the invention, the configured substrate 200 further includes a plurality of second deposition sites 204, each of which is located in a second plane located on the exposed horizontal surface portions of the first photoresist layer 104. As will be explained more fully below, the first and second deposition sites 202 and 204 are advantageously separated by a distance substantially equal to the thickness of the second photoresist layer 106. Like the first deposition sites 202, horizontal portions of the configured substrate 200 which border the second deposition sites 204 are not located in the second plane.

After the substrate has been configured as illustrated in FIG. 2, a thin film of predetermined material is deposited thereon using known techniques, i.e., chemical vapor deposition (CVD) or sputtering techniques. FIG. 4 provides an illustration of the substrate and deposition sites after the thin film has been deposited. It will be apparent to those skilled in the art that many techniques may be used for depositing materials and that one or more materials may be deposited, simultaneously or sequentially.

Advantageously, the thickness of the deposited material is much less than the thickness of the separation between the first and second deposition sites 202 and 204, i.e., the thickness of the second photoresist layer 106, so that the material deposited on the first deposition site 202 is completely separated from the material deposited on the second deposition site 204. As examples, the thin film may be deposited to thicknesses on the order of hundreds of angstroms while the thickness of the second photoresist layer 106 is on the order of thousandths of inches.

As is also known in the art, the electromagnetic characteristics of the resulting particulate will be dependent upon the thickness and area of the particulate as well as the material that is deposited. Typically, the desired thickness and area may be determined by experimenting with different thicknesses and areas to determine which geometry provides the desired characteristics. Also, metals and metal oxides are commonly chosen as the material to be deposited, e.g., gold, silver, aluminum oxide and tantalum pentoxide.

After deposition of the thin film has been completed, the particulate may be removed by washing the cured photoresist from the base portion 102 of the substrate 200 and removing the particulate from the chemical wash. Preferably, the chemical wash will be selected so that it will not interfere with the size and geometry of the configured particles or otherwise react with the particulate.

After the particles have been produced, they are combined with a suitable binder as a pigment therefor. The binder and particulate comprise a coating that may be applied to objects to give the covered object the desired electromagnetic characteristics. Preferably, the binder is selected to further enhance or maximize the desired characteristics of the resulting coating. In any event, the binder is selected to minimize any detrimental effects upon the desired characteristics of the coating. Binders having these properties are commercially available and well known to those skilled in the art. Although the invention is described herein by reference to particulates in combination with binders to produce coatings, it will be apparent that particles produced by the method of the present invention may be combined with any matrix material to produce materials having desired electromagnetic properties.

It will be apparent to those skilled in the art that particulate matter produced by the foregoing method will obtain areas, shapes and thicknesses which may be controlled within strict tolerances without the need for sorting or producing waste particulate. This is because the tiered configuration of the substrate 200 allows each particle to be produced as a separate unit from each remaining particle. As a practical matter, however, it will be noted that the corners 206 of each first deposition site may be joined, at least in part, to the corners of diagonally neighboring deposition sites. A similar joining may result for the corners of each second deposition site. The joining is inconsequential, however, as the particle units may be readily separated, one from another.

Further, it will be apparent to those skilled in the art that it is desirable to provide a substrate configuration wherein substantially all horizontal surfaces of the substrate lie in a plane that includes one or more deposition sites. Some shapes, e.g., a star shape, do not allow for this configuration. In these cases, those portions of the substrate which are located in a plane that includes a deposition site will comprise waste particulate, thereby introducing the need to separate the waste particulate from the desired particulate.

Accordingly, the preferred configuration is that illustrated in FIG. 2 wherein substantially the entire horizontal surface of the substrate 200 is located in a plane that includes a deposition site. In this embodiment, substantially all of the chemical material deposited on the substrate is eventually used as the particulate. Other shapes are possible which allow for substantially all of the substrate to result in usable particulate.

Still further, in those cases where the desired shape of the particulate precludes production without any waste, the area of the waste particulate can be selected to allow ready separation from the desired particulate.

Another advantage of the present invention is illustrated in the diagram of FIG. 3. Therein, an exaggerated illustration of the sides 300 of a first deposition site 202 is provided. As is known in photomasking techniques, the edge portion 300, which comprises a vertical surface of the second photoresist layer 106, of a washed photoresist layer is typically undercut as a result of nonuniform curing beyond the outer surface. The present invention, however, makes advantageous use of this undercut during the material deposition process. In the presently preferred embodiment of the invention, the material is deposited using line-of-sight deposition techniques. Line-of-sight deposition substantially prevents the desired material from being deposited upon the edge portion 300 of the substrate 200, thereby preventing connection between particles deposited on the first and second deposition sites 202 and 204.

Preferably, the desired material is deposited using a line-of-sight chemical deposition technique so that the area of the second deposition sites 204 upon which the desired material is deposited is defined by the area of the first deposition sites 202. Therefore, any undercutting that results from the photomask technique will not affect the area of either the first deposition sites or the second deposition sites.

While only several presently preferred embodiments of our novel invention have been described in detail herein, many modifications and variations thereof will readily become apparent to those skilled in the art. It is our intention, by the appended claims, to include all such modifications and variations which fall within the true scope and spirit of our invention.

We claim:

1. A method for producing particulate matter from a predetermined material, the particulate being produced with a controlled area and thickness, said method comprising the steps of:
    configuring a substrate to include a first plurality of deposition sites located in at least a first plane, wherein the size and shape of the area of each first deposition site is configured to the desired size and shape of the area of the particles to be produced and wherein portions of the substrate that surround each first deposition site are not located in the first plane;
    vaporizing the predetermined material and permitting the vaporized predetermined material to condense on the configured substrate for a time period selected to control the thickness of the particulate being produced wherein the material is vaporized substantially perpendicular to said substrate to minimize the amount of material condensed upon the vertical surfaces of said substrate, and whereby the thickness of the vaporized material is less than the height of the vertical surfaces so that the material vaporized on said plurality of first deposition sites is readily separable from material vaporized on other surfaces of said substrate; and
    dissolving portions of the substrate to liberate the predetermined material and thereby to obtain a plurality of particles having the desired area and thickness.

2. A method for producing particulate matter from a predetermined material, the particulate being produced with a controlled area and thickness, said method comprising the steps of:
    configuring a substrate to include a first plurality of deposition sites located in at least a first plane, wherein the size and shape of the area of each first deposition site is configured to the desired size and shape of the area of the particles to be produced and wherein portions of the substrate that surround each first deposition site are not located in the first plane, said step of configuring comprising the substeps of:
        coating the substrate with photoresist material;
        selectively curing portions of the photoresist material; and
        removing all uncured portions of the photoresist material using an appropriate solvent to provide the plurality of first deposition sites;
    vaporizing the predetermined material and permitting the vaporized predetermined material to condense on the configured substrate for a time period selected to control the thickness of the particulate being produced wherein the material is vaporized substantially perpendicular to said substrate to minimize the amount of material condensed upon the vertical surfaces of said substrate, and whereby the thickness of the vaporized material is less than the height of the vertical surfaces so that the material vaporized on said plurality of first deposition sites is readily separable from material vaporized on other surfaces of said substrate; and
    dissolving portions of the substrate to liberate the predetermined material and thereby to obtain a plurality of particles having the desired area and thickness.

3. The method as recited in claim 2 wherein the substep of curing portions of the substrate comprises the substeps of:
    providing a mask to cover the substrate wherein the mask includes a pattern of opaque and transparent portions;
    covering the substrate with the patterned mask; and
    exposing the covered substrate to energy so that the substrate will be selectively cured to produce the plurality of first deposition sites.

4. The method as recited in claim 3 wherein the step of removing the material from the substrate comprises the substeps of:
    dissolving substantially all cured photoresist using an appropriate solvent, thereby to liberate the deposited material; and
    separating the plurality of particles from the solvent to provide a plurality of particles having the desired area.

5. The method as recited in claim 1 wherein the step of vaporizing the predetermined material upon the substrate comprises the substep of vaporizing the predetermined material by chemical vapor deposition (CVD).

6. The method as recited in claim 1 wherein the step of vaporizing the predetermined material upon the substrate comprises the substep of vaporizing the predetermined material by sputtering.

7. The method as recited in claim 1 wherein the step of configuring the substrate further comprises the substep of configuring the substrate to include a second plurality of deposition sites located in at least a second plane, wherein the size and shape of the area of each second deposition site is configured to the desired size and shape of the area of the particles to be produced and wherein substantially all portions of the substrate that surround each second deposition site are not located in the second plane.

8. The method as recited in claim 9 wherein the step of configuring the substrate comprises the substep of configuring the substrate so that substantially all horizontal surfaces of the substrate are positioned in the first and second planes.

9. A method for producing a composite having predetermined characteristics, said method comprising the steps of:

producing a plurality of particles wherein the area, thickness and material of the particles are selected to provide the predetermined characteristics, the plurality of particles being produced by depositing the selected material upon a configured substrate wherein the configured substrate has a plurality of first deposition sites located in a first plane and wherein the area of each first deposition site corresponds to the selected area of the particles to be produced, the configured substrate being structured so that portions of the configured substrate that border each first deposition site are not positioned in the first plane, the material being deposited by vaporizing the material and permitting the material to condense on the configured substrate for a time period selected to control the thickness of the particles being produced so that when removed, particles are produced having the selected area and thickness wherein the material is vaporized substantially perpendicular to said substrate to minimize the amount of material condensed upon the vertical surfaces of said substrate, and whereby the thickness of the vaporized material is less than the height of the vertical surfaces so that the material vaporized on said plurality of first deposition sites is readily separable from material vaporized on other surfaces of said substrate; and combining the produced particles with a matrix to produce the composite, wherein the matrix is selected to further enhance the desired characteristics of the resulting composite.

10. The method as recited in claim 9 wherein the step of producing the plurality of particles comprises the substep of configuring the substrate to include a second plurality of deposition sites located in at least a second plane, wherein the area of each second deposition site corresponds to the selected area of the particles to be produced and wherein substantially all portions of the substrate that surround each second deposition site are not located in the second plane.

11. The method as recited in claim 10 wherein the step of producing the plurality of particles comprises the substep of configuring the substrate so that substantially all horizontal surfaces of the substrate are positioned in the first and second planes.

12. A method for producing particulate matter from a predetermined material, said method comprising the steps of:

configuring a substrate to include a plurality of deposition sites wherein the size and shape of the area of the plurality of deposition sites is configured to the desired size and shape of the particles to be produced, a portion of the perimeter of the plurality of deposition sites being an edge wherein vertical substrate portions extend downwardly from the edges of the plurality of deposition sites;

vaporizing the predetermined material and permitting the vaporized predetermined material to condense on the plurality of deposition sites for a time period selected to control the thickness of the particulate being produced; and dissolving portions of the substrate to liberate the predetermined material and thereby to obtain a plurality of particles having the desired area and thickness.

* * * * *

UNITED STATES PATENT AND TRADEMARK OFFICE
CERTIFICATE OF CORRECTION

PATENT NO.  : 5,100,599
DATED       : March 31, 1992
INVENTOR(S) : Robert J. Gurnick; David G. Jensen It is certified that error appears in the above-identified patent and that said Letters Patent is hereby corrected as shown below:

In column 7, claim 8, line 3, please delete "claim 9" and substitute therefor -- claim 7 --.

Signed and Sealed this

Fifteenth Day of June, 1993

Attest:

MICHAEL K. KIRK

*Attesting Officer*     Acting Commissioner of Patents and Trademarks